(12) United States Patent
Yi

(10) Patent No.: US 7,447,088 B2
(45) Date of Patent: Nov. 4, 2008

(54) SEMICONDUCTOR MEMORY DEVICE HAVING AN OPEN BIT LINE STRUCTURE, AND METHOD OF TESTING THE SAME

(75) Inventor: Chul-Woo Yi, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 95 days.

(21) Appl. No.: 11/625,606

(22) Filed: Jan. 22, 2007

(65) Prior Publication Data
US 2007/0171742 A1    Jul. 26, 2007

(30) Foreign Application Priority Data
Jan. 25, 2006  (KR) .................. 10-2006-0007731

(51) Int. Cl.
*G11C 7/00* (2006.01)
(52) U.S. Cl. ................ 365/201; 365/230.03; 365/210.1
(58) Field of Classification Search ............ 365/230.03, 365/201, 210
See application file for complete search history.

(56) References Cited

U.S. PATENT DOCUMENTS

| 6,535,439 | B2 | 3/2003 | Cowles | |
| 6,650,584 | B2 * | 11/2003 | Cowles | 365/201 |
| 7,224,596 | B2 * | 5/2007 | Jeong et al. | 365/63 |
| 7,307,897 | B2 * | 12/2007 | Shin | 365/189.09 |
| 7,313,036 | B2 * | 12/2007 | Kim | 365/200 |
| 7,382,668 | B2 * | 6/2008 | Park et al. | 365/201 |
| 2007/0104006 | A1 * | 5/2007 | Hwang | 365/210 |
| 2007/0153612 | A1 * | 7/2007 | Lee et al. | 365/226 |

FOREIGN PATENT DOCUMENTS

| JP | 2001-118397 | 4/2001 |
| JP | 2001-189098 | 7/2001 |

* cited by examiner

*Primary Examiner*—Huan Hoang
*Assistant Examiner*—Michael J Weinberg
(74) *Attorney, Agent, or Firm*—F. Chau & Assoc., LLC

(57) ABSTRACT

A memory core having an open bit line structure and a semiconductor memory device having the memory core includes an edge sub-array and a dummy bit line control circuit. The edge sub-array has a plurality of word lines, a plurality of bit lines and a plurality of dummy bit lines. The dummy bit line control circuit amplifies and latches voltage signals of the dummy bit lines in a test sensing mode. Accordingly, the semiconductor memory device having the memory core may test defects of the edge sub-array included in the memory core.

19 Claims, 7 Drawing Sheets

200

SEMICONDUCTOR MEMORY DEVICE HAVING AN OPEN BIT LINE STRUCTURE, AND METHOD OF TESTING THE SAME

CROSS-REFERENCE TO RELATED APPLICATION

This application claims priority under 35 U.S.C. § 119 to Korean Patent Application No. 2006-7731 filed on Jan. 25, 2006, the contents of which are herein incorporated by reference in their entirety.

BACKGROUND OF THE INVENTION

1. Technical Field

The present disclosure relates to a semiconductor memory device, and particularly to a semiconductor memory device having an open bit line structure and a method of testing thereof.

2. Discussion of Related Art

A semiconductor memory device is used for storing data. A random access memory device (RAM) is a volatile memory device and is mainly used as a main memory device of a computer. A dynamic random access memory device (DRAM), which is a kind of volatile RAM, is comprised of memory cells. In general, a memory cell comprising a transistor and a capacitor may store information as a charge in the form of "1" or "0." Capacitors included in memory cells are periodically refreshed, because charges stored in the capacitors may be lost as time goes by.

The memory cells of a DRAM are coupled to word lines and bit lines. When transistors included in the memory cells are turned on, data stored in the capacitors will be outputted or data of a bit line will be transferred to the capacitors.

A semiconductor memory device is classified into a semiconductor memory device having a folded bit line structure and a semiconductor memory device having an open bit line structure, according to the structure of the memory cell array. The memory cell array of a semiconductor memory device having an open bit line structure includes edge sub-arrays having dummy bit lines. The dummy bit lines are not coupled to sense amplifiers and data may not be stored in the memory cells coupled to the dummy bit lines.

FIG. 1 is a schematic diagram illustrating a memory core of a conventional semiconductor memory device having an open bit line structure.

Referring to FIG. 1, the memory core 100 of a semiconductor memory device includes edge sub-arrays 120 and 130, non-edge sub-arrays 110, and sense amplifiers 140-1 to 140-$n$ and 150-1 to 150-$n$. The non-edge sub-arrays 110 include bit lines corresponding to horizontal lines and word lines corresponding to vertical lines, and a memory cell is located at each of the intersecting points 111 of a word line and a bit line. The edge sub-arrays 120 and 130 include word lines WL, bit lines BL and dummy bit lines DBL. A memory cell is located at each of the intersecting points 121 and 123 of a word line WL and a bit line BL, and at each of the intersecting points 121 and 123 of a word line WL and a dummy bit line DBL.

As shown in FIG. 1, the dummy bit lines DBL are not coupled to sense amplifiers. Therefore, data may not be sensed or read through the dummy bit lines DBL included in the edge sub-arrays 120 and 130. Accordingly, it is not easy to input data to the dummy bit lines DBL and sense the data from the dummy bit lines DBL in a test mode.

FIG. 2 is a schematic diagram illustrating a conventional semiconductor memory device having sense amplifier circuits and memory cell arrays. Referring to FIG. 2, the semiconductor memory device 170 includes a bit line BL, bit line bar BLB, an equalizer 173 coupled between the bit line BL and the bit line bar BLB, a p-type sense amplifier 174, an n-type sense amplifier 175 and a column selecting circuit 176. Further, the semiconductor memory device 170 includes a memory cell 171 coupled between a word line WLi and a bit line BL, and a memory cell 172 coupled between a word line WLj and a bit line bar BLB.

The memory cell 171 includes a cell switch MN1 and a cell capacitor C1. The bit line BL has capacitance CBL and the bit line bar BLB has capacitance CBLB. When data stored in the cell capacitor C1 is outputted to the bit line BL, charge sharing is generated between the cell capacitor C1 and the bit line BL, which has the capacitance CBL.

FIG. 3 is a schematic diagram illustrating a memory core of another conventional semiconductor memory device having an open bit line structure, and is disclosed in U.S. Pat. No. 6,535,439. The semiconductor memory device in FIG. 3 includes sense amplifiers 260-1 to 260-$n$ and 270-1 to 270-$n$ to more accurately test the edge sub-arrays included in the semiconductor memory device.

The semiconductor memory device in FIG. 3, however, may occupy a large area in the semiconductor integrated circuit, because each of the dummy bit lines is coupled to each of the sense amplifiers.

SUMMARY OF THE INVENTION

Exemplary embodiments of the present invention provide a memory core that may provide different voltage signals to dummy bit lines included in edge sub-arrays according to the operation mode, and provide a voltage signal having a complete logic state to the dummy bit lines without sense amplifiers.

Exemplary embodiments of the present invention also provide a semiconductor memory device including a memory core that may provide different voltage signals to dummy bit lines included in edge sub-arrays according to the operation mode and that provide a voltage signal having a complete logic state to the dummy bit lines without sense amplifiers.

Exemplary embodiments of the present invention also provide a method of testing a semiconductor memory device that may provide different voltage signals to dummy bit lines included in edge sub-arrays according to the operation mode and that provide a voltage signal having a complete logic state to the dummy bit lines without sense amplifiers.

According to an exemplary embodiment of the present invention, there is provided a memory core including an edge sub-array and a dummy bit line control circuit.

The edge sub-array has a plurality of word lines, a plurality of bit lines and a plurality of dummy bit lines. The dummy bit line control circuit amplifies and latches voltage signals of the dummy bit lines in a test sensing mode.

In an exemplary embodiment of the present invention, the dummy bit line control circuit provides a bit line precharge voltage to the dummy bit lines in a normal mode, and provides a voltage signal having a logic state opposite from a logic state of voltage signals of the bit lines to the dummy bit lines in a test write mode.

In an exemplary embodiment of the present invention, the dummy bit line control circuit includes a first switch, a second switch and a latch circuit.

The first switch provides the bit line precharge voltage to the dummy bit lines in response to a normal mode signal. The second switch provides a high supply voltage or a low supply voltage to the dummy bit lines in response to a test write mode signal. The latch circuit amplifies and latches the voltage signals of the dummy bit lines in response to a test sensing mode signal.

In an exemplary embodiment of the present invention, the latch circuit does not operate when the test sensing mode signal is disabled.

In an exemplary embodiment of the present invention, the lath circuit has a feedback loop configured to buffer the voltage signals of the dummy bit lines.

According to an exemplary embodiment of the present invention, there is provided a semiconductor memory device including a memory core coupled to bit line pairs, a column selecting circuit, a local sense amplifier, an input/output sense amplifier and an input/output buffer.

The column selecting circuit provides voltage signals of the bit lien pairs to local input/output line pairs in response to a column selecting signal. The local sense amplifier amplifies voltage signals of the local input/output line pairs to provide the amplified voltage signals to global input/output line pairs. The input/output sense amplifier amplifies voltage signals of the global input/output line pairs. The input/output buffer buffers an output signal of the input/output sense amplifier to output or buffers input data.

The memory core includes an edge sub-array and a dummy bit line control circuit. The edge sub-array has a plurality of word lines, a plurality of bit lines and a plurality of dummy bit lines. The dummy bit line control circuit amplifies and latches voltage signals of the dummy bit lines in a test sensing mode.

According to an exemplary embodiment of the present invention, there is provided a method of testing a semiconductor memory device including writing data to bit lines in a test write mode, providing a voltage signal having a logic state opposite from a logic state of voltage signals of the bit lines to dummy bit lines in the test write mode, and amplifying and latching the voltage signals of the dummy bit lines in a test sensing mode.

In an exemplary embodiment of the present invention, the method of testing a semiconductor memory device may include buffering and feeding back the voltage signals of the dummy bit lines.

Accordingly, defects in a memory cell array may be easily examined by amplifying voltage signals of the dummy bit lines.

BRIEF DESCRIPTION OF THE DRAWINGS

Exemplary embodiments of the present invention will be understood in more detail from the following descriptions taken in conjunction with the accompanying drawings in which.

DESCRIPTION OF THE EXEMPLARY EMBODIMENTS

Figure 1:
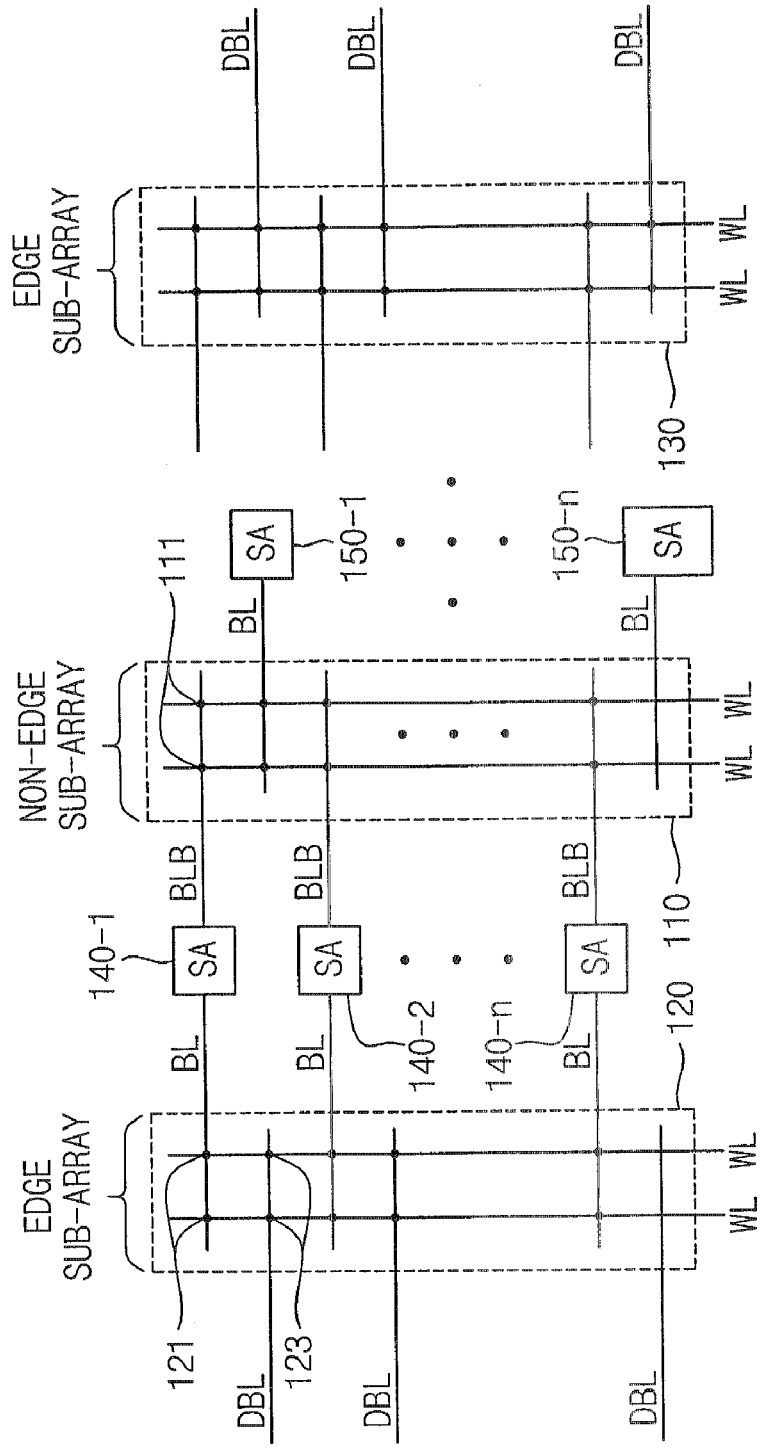
FIG. 1 is a schematic diagram illustrating a memory core of a conventional semiconductor memory device having an open bit line structure.
Figure 2:
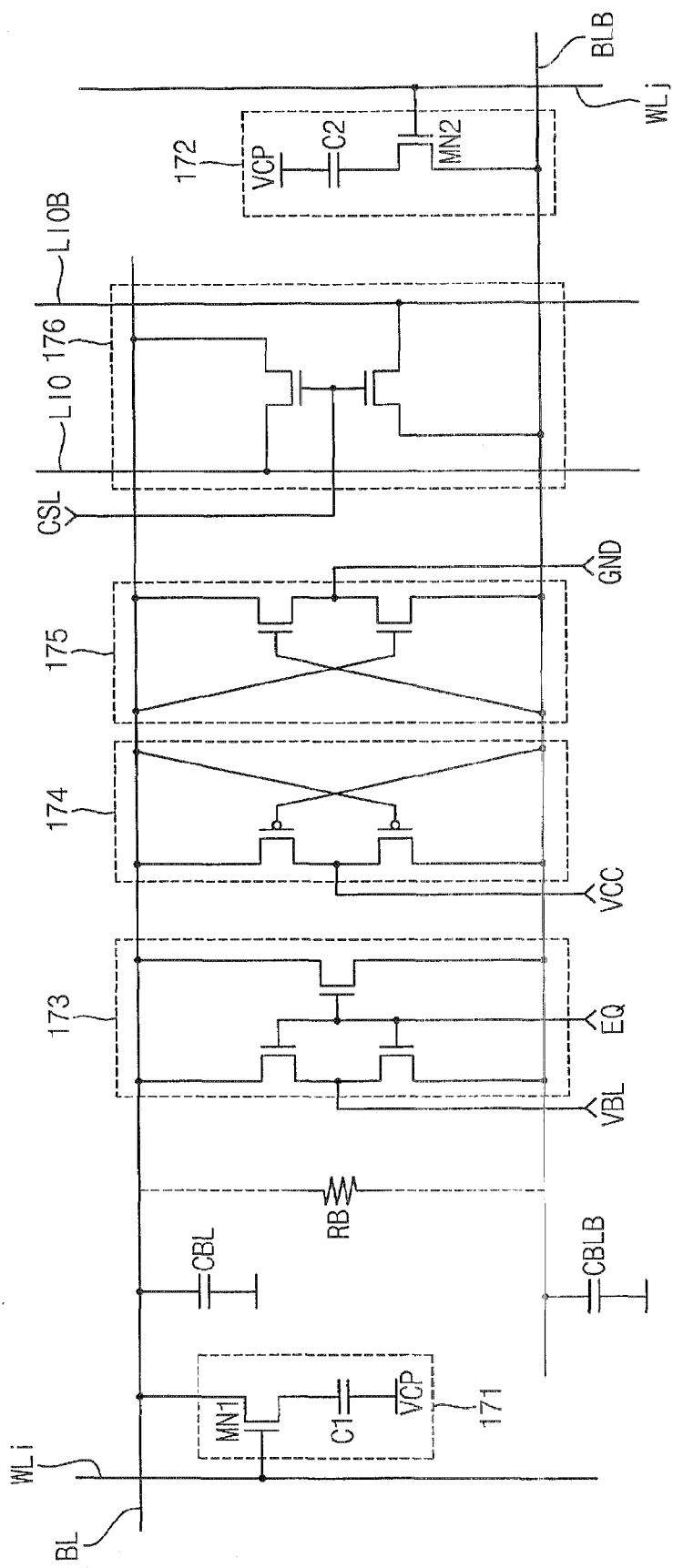
FIG. 2 is a schematic diagram illustrating a conventional semiconductor memory device having sense amplifier circuits and memory cell arrays.

Exemplary embodiments of the present invention are disclosed herein, however, specific structural and functional details disclosed herein are merely representative for purposes of describing the exemplary embodiments of the present invention. Thus, exemplary embodiments of the present invention may be embodied in many alternate forms and should not be construed as limited to the exemplary embodiments of the present invention set forth herein.

Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention. Like numbers refer to like elements throughout the description of the figures.

Figure 4:
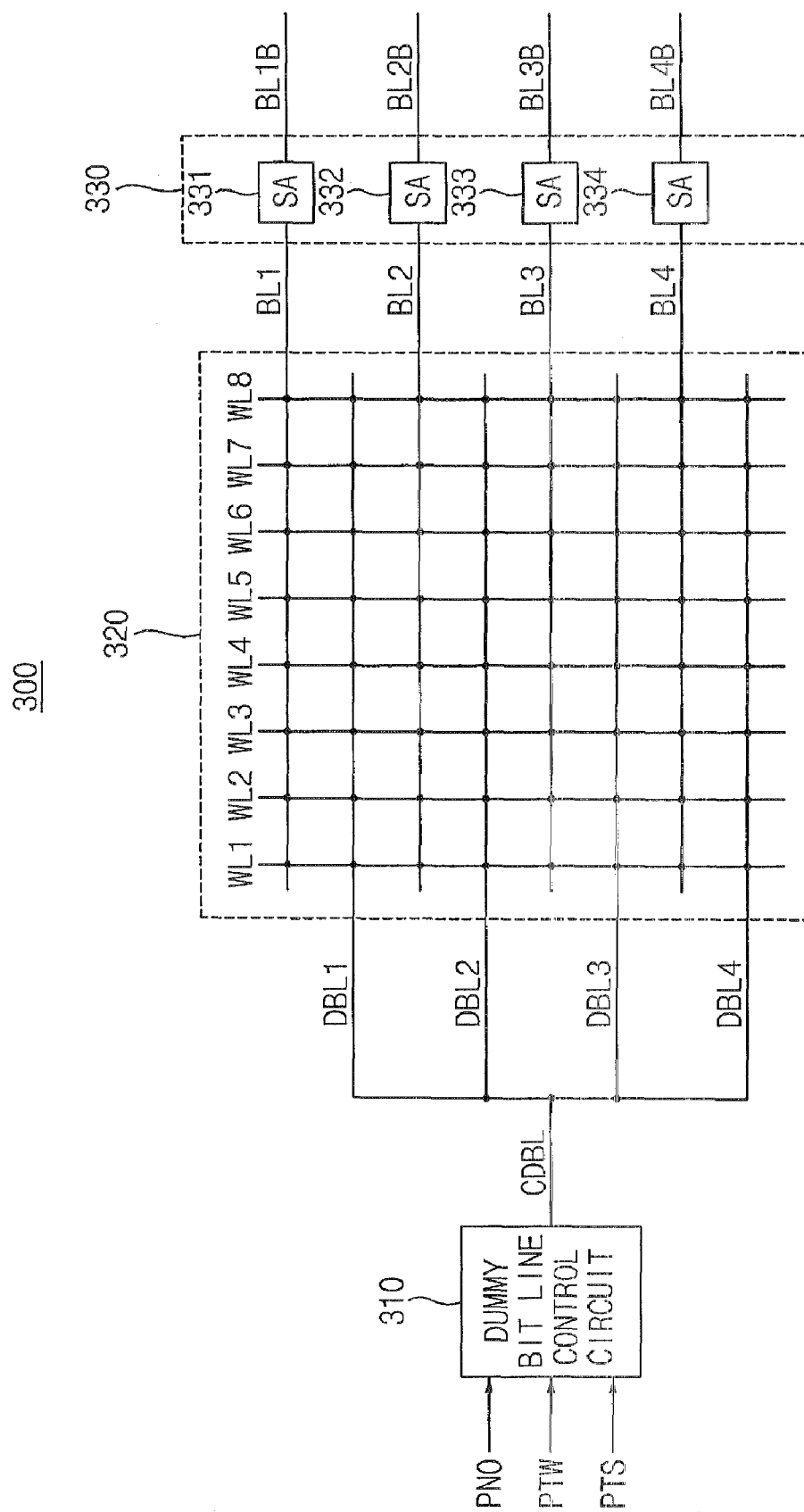
FIG. 4 is a schematic diagram illustrating a memory core of a semiconductor memory device having an open bit line structure according to an exemplary embodiment of the present invention.

FIG. 4 is a schematic diagram illustrating a memory core of a semiconductor memory device having an open bit line structure according to an exemplary embodiment of the present invention.

Figure 3:
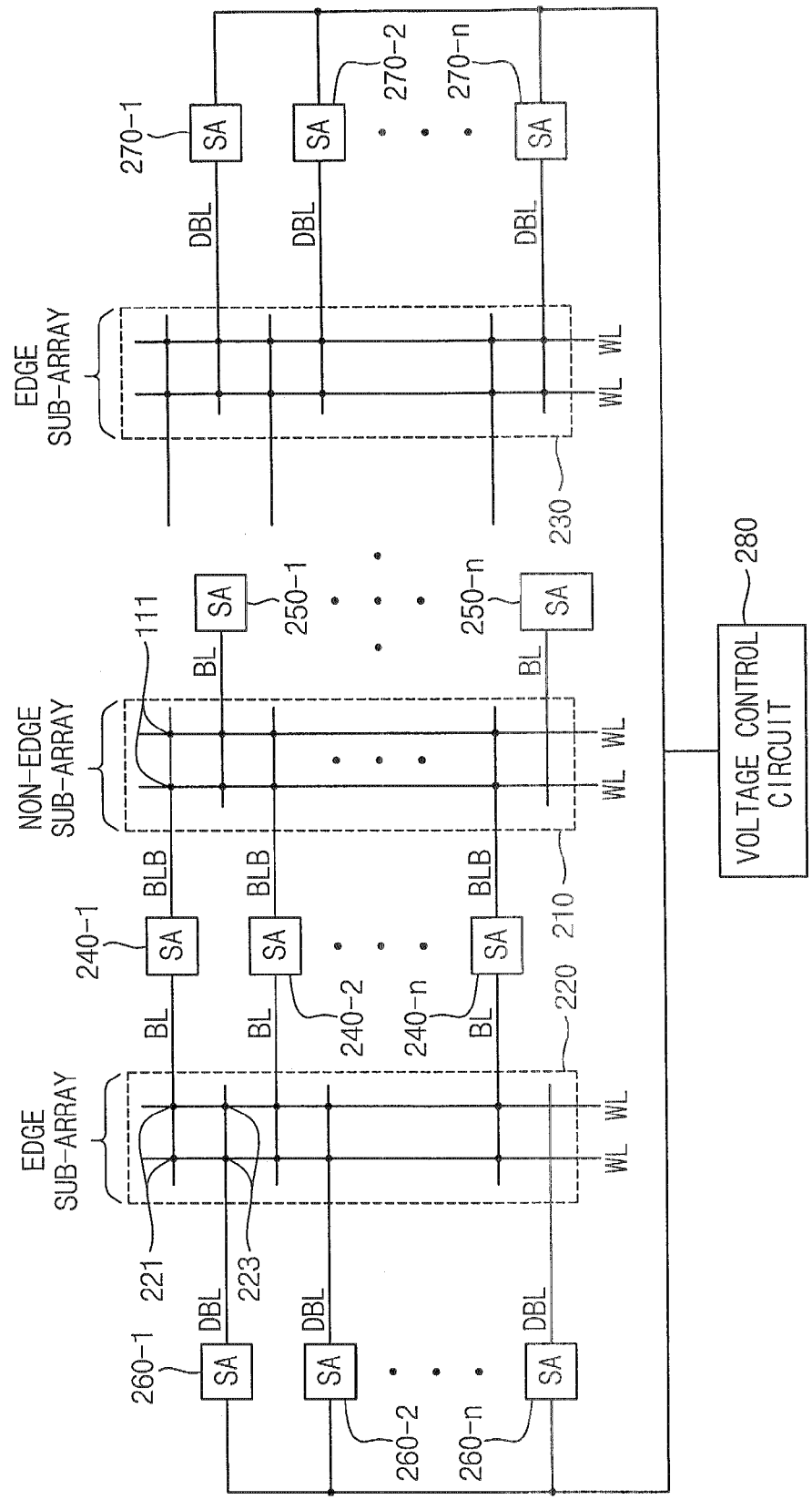
FIG. 3 is a schematic diagram illustrating a memory core of another conventional semiconductor memory device having an open bit line structure.

Referring to FIG. 4, the memory core 300 includes an edge sub-array 320, a sense amplifier circuit 330 and a dummy bit line control circuit 310. The memory core in FIG. 4 also includes non-edge sub-arrays such as the conventional memory core shown in FIG. 3. The non-edge sub-arrays are omitted in FIG. 4, however, for the convenience of explanation.

The edge sub-array 320 includes word lines WL1 to WL8, bit lines BL1 to BL4 and dummy bit lines DBL1 to DBL4. A memory cell is located at each of the intersecting points of the word lines WL1 to WL8 and the bit lines BL1 to BL4 and at each of the intersecting points of the word lines WL1 to WL8 and the dummy bit lines DBL1 to DBL4. The sense amplifier circuit 330 includes sense amplifiers 331 to 334, and is coupled to the edge sub-array 320 through the bit lines BL1 to BL4 and coupled to the non-edge sub-arrays (not shown) through the bit line bars BL1B to BL4B. The sense amplifier circuit 330 amplifies voltages of the bit lines BL1 to BL4 and the bit line bars BL1B to BL4B.

The dummy bit line control circuit 310 generates a dummy bit line control signal CDBL in response to a normal mode signal PNO, a test write mode signal PTW and a test sensing mode signal PTS. The dummy bit line control signal CDBL is provided to the dummy bit lines DBL1 to DBL4.

Figure 5:
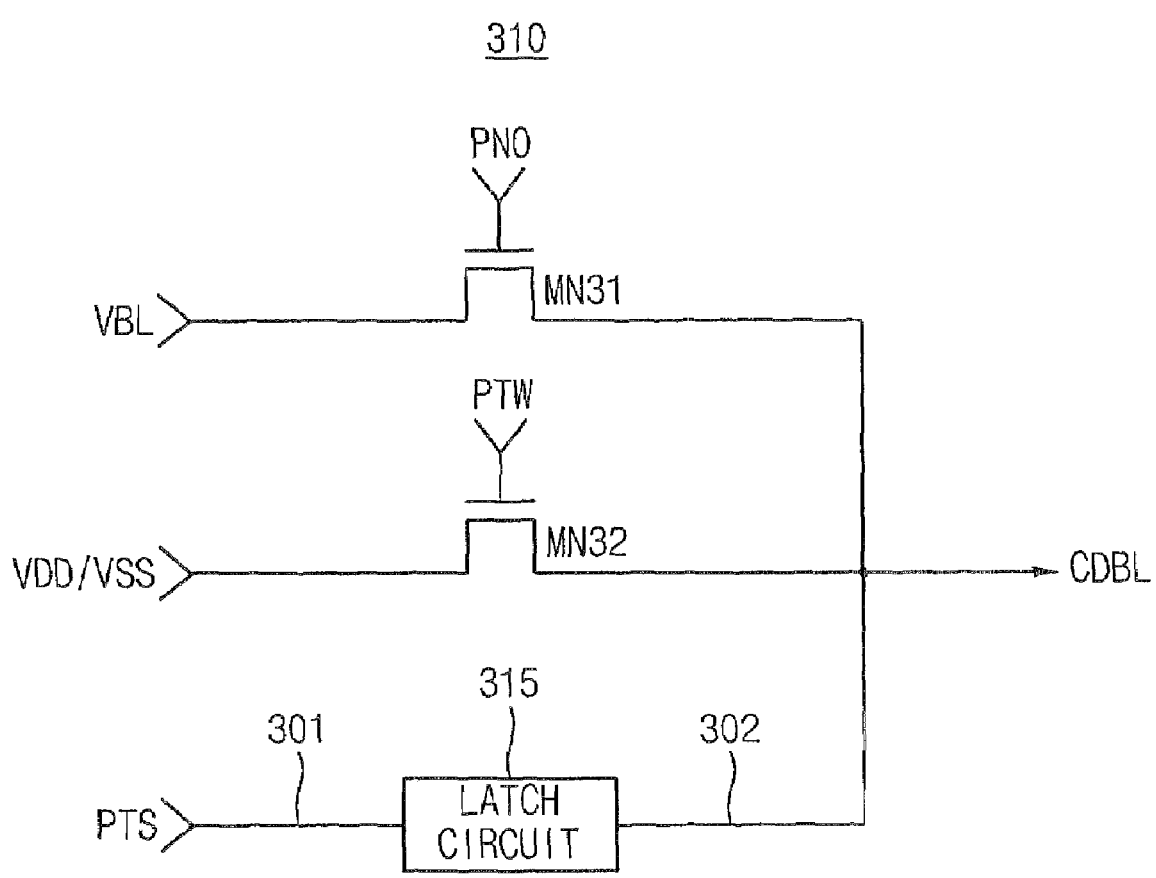
FIG. 5 is a circuit diagram illustrating a dummy bit line control circuit included in a memory core of the semiconductor memory device shown in FIG. 4.

FIG. 5 is a circuit diagram illustrating an exemplary embodiment of a dummy bit line control circuit 310 included in a memory core of a semiconductor memory device shown in FIG. 4.

Referring to FIG. 5, the dummy bit line control circuit 310 includes n-channel metal oxide semiconductor memory devices (NMOS) MN31 and MN32, and a latch circuit 315. The NMOS transistor MN31 outputs a bit line precharge voltage VBL as the dummy bit line control signal CDBL in response to the normal mode signal PNO. The NMOS transistor MN32 outputs a high supply voltage VDD or a low supply voltage VSS as the dummy bit line control signal CDBL in response to the test write mode signal PTW. The latch circuit 315 receives the test sensing mode signal PTS through the line 301, and amplifies and latches voltage signals of the dummy bit lines DBL1 to DBL4 in response to the test sensing mode signal PTS. The latch circuit 315 is coupled to the dummy bit lines DBL1 to DBL4 through a line 302.

In FIG. 5, the NMOS transistors MN31 and MN32 function as switches, and may be replaced by some other device that performs a switch function, such as a transmission gate. In FIG. 4 and FIG. 5, the normal mode signal PNO and the test write mode signal PTW may be the same signal having different phases from each other. Further, in FIG. 5, the bit line precharge voltage VBL and the supply voltages VDD or BSS may be received through the same input terminal.

Hereinafter, the operation of the memory core 300 of a semiconductor memory device according to an exemplary embodiment of the present invention will be described referring to FIG. 4 and FIG. 5.

In the memory cell array of the memory core 300, there may exist bridges or defects. For example, there may be resistive bridges between cell capacitors, between the bit lines BL1 to BL4 and the bit line bars BL1B to BL4B, or between the bit lines BL1 to BL4 and the dummy bit lines DBL1 to DVL4. These bridges or defects may be detected by a test process, such as a burn-in test in the wafer or package state.

In the case of a non-edge sub-array, the resistive bridges may be detected by applying complementary voltage signals to each of the bit line and the bit line bar. In the case of the edge sub-array, however, the write operation of data is relatively easy to perform, while the sensing operation of the data stored in the memory cell is not easy to perform. Therefore, in the case of the edge sub-array, the sensing of the data stored in the memory cell needs to be performed in a different way from the case of the non-edge sub-array.

The memory core 300 of a semiconductor memory device shown in FIG. 4 includes a dummy bit line control circuit 310 that generates a dummy bit line control signal CDBL having different voltages according to the operation modes.

Referring to FIG. 5, the normal mode signal PNO is enabled and the NMOS transistor MN31 is turned on in a normal mode. Therefore, the bit line precharge voltage VBL is outputted as the dummy bit line control signal CDBL. In this exemplary embodiment, the test write mode signal PTW and the test sensing mode signal PTS are disabled in the normal mode. Therefore, the NMOS transistor MN32 is turned off and the latch circuit 315 does not operate.

In a test write mode, the test write mode signal PTW is enabled and the NMOS transistor MN32 is turned on. The high supply voltage VDD or the low supply voltage VSS is outputted as the dummy bit line control signal CDBL. In this exemplary embodiment, the normal mode signal PNO and the test sensing mode signal PTS are disabled in the test write mode. Therefore, the NMOS transistor MN31 is turned off and the latch circuit 315 does not operate.

For example, the dummy bit line control circuit 310 provides the bit line precharge voltage VBL to the dummy bit lines DBL1 to DBL4 in the normal mode, and provides a voltage signal having a logic state opposite from the logic state of voltage signals of the bit lines BL1 to BL4 to the dummy bit lines DBL1 to DBL4 in the test write mode. In a test sensing mode, the dummy bit line control circuit 310 amplifies and latches voltage signals of the dummy bit lines DBL1 to DBL4.

Referring to FIG. 4, in the test write mode, when data of logic "0" is written in the bit lines BL1 to BL4 that are in the edge sub-array 320, data of logic "1" will be written in the dummy bit lines DBL1 to DBL4. It is desirable that a voltage signal applied to the dummy bit lines DBL1 to DBL4 have a logic state different from the logic state of a voltage signal applied to the bit lines BL1 to BL4 to detect resistive bridges that may exist between the cell capacitor coupled to the bit lines BL1 to BL4 and the cell capacitor coupled to the dummy bit lines DBL1 to DBL4. In the test write mode, when data of logic "1" is written in the bit lines BL1 to BL4 that are in the edge sub-array 320, data of logic "0" will be written in the dummy bit lines DBL1 to DBL4.

Accordingly, the semiconductor memory device including a memory core that has the structure as shown in FIG. 4 is able to detect bridges or defects that may be generated in the edge sub-array of the memory core.

Figure 6:
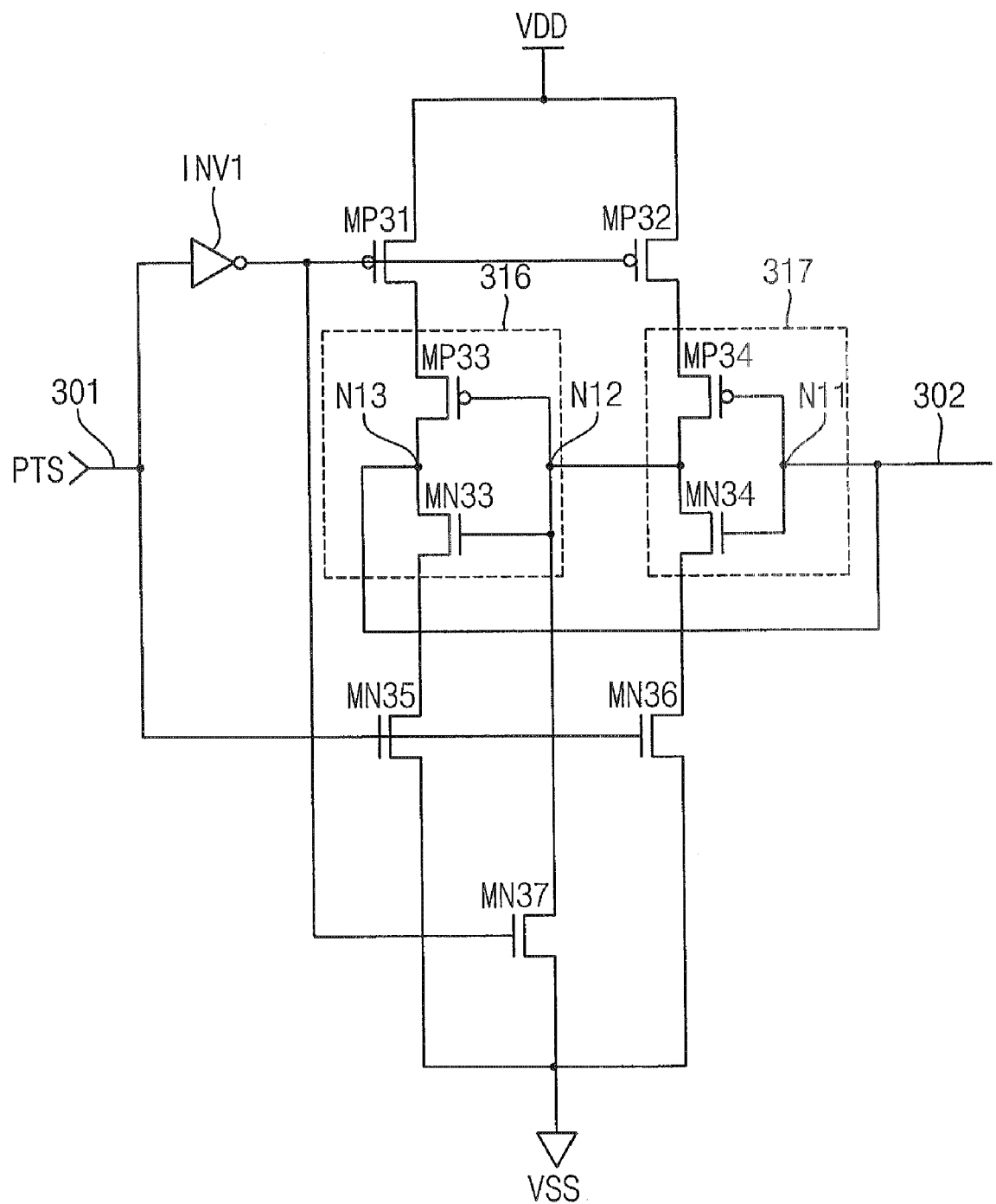
FIG. 6 is a circuit diagram illustrating a latch circuit included in a dummy bit line control circuit in FIG. 5.

FIG. 6 is a circuit diagram illustrating an exemplary embodiment of the latch circuit 315 included in the dummy bit line control circuit 310 shown in FIG. 5.

Referring to FIG. 6, the latch circuit 315 includes an inverter INV1, PMOS transistors MP31 to MP34 and NMOS transistors MN33 to MN37.

The inverter INV1 inverts the test sensing mode signal PTS. Each of the PMOS transistor MP31 and the PMOS transistor MP32 has a gate coupled to an output terminal of the inverter INV1, and a source to which a high supply voltage VDD is applied. Each of the NMOS transistor MN35 and the NMOS transistor MN36 has a gate to which the test sensing mode signal PTS is applied, and a source to which a low supply voltage VSS is applied.

The PMOS transistor MP33 has a source coupled to a drain of the PMOS transistor MP31, a drain coupled to a first node N13 and a gate coupled to a second node N12. The NMOS transistor MN33 has a drain coupled to the first node N13, a gate coupled to the second node N12, and a source coupled to a drain of the NMOS transistor MN35.

The PMOS transistor MP34 has a source coupled to a drain of the PMOS transistor MP32, a drain coupled to the second node N12, and a gate coupled to a third node N11. The NMOS transistor MN34 has a drain coupled to the second node N12, a gate coupled to the third node N11, and a source coupled to a drain of the NMOS transistor MN36.

In FIG. 6, the third node N11 is electrically coupled to the first node N13 and coupled to the dummy bit lines DBL1 to DBL4 in FIG. 4 through a line 302. The PMOS transistor MP33 and the NMOS transistor MN33 construct an inverter 316, and the PMOS transistor MP34 and the NMOS transistor MN34 construct an inverter 317.

Hereinafter, the operation of the latch circuit 315 shown in FIG. 6 will be described.

When the test sensing mode signal PTS has a logic "low" state, that is, the test sensing mode signal PTS is disabled, the PMOS transistors MP31 and MP32 and the NMOS transistors MN35 and MN36 are turned off. Therefore, when the test sensing mode signal PTS has a logic "low" state, the latch circuit 315 in FIG. 6 does not operate. In this exemplary embodiment, the NMOS transistor MN37 is turned on to pull down the second node N12. That is, the NMOS transistor MN37 maintains the second node N12 in logic "low" state, and thereby determines an initial voltage value of the second node N12 when the test sensing mode signal PTS is enabled.

When the test sensing mode signal PTS has a logic "high" state, that is, the test sensing mode signal PTS is enabled, the PMOS transistors MP31 and MP32 and the NMOS transistors MN35 and MN36 are turned on. The voltage of the third node MN11 is amplified and latched by the inverters 317 and 316, and fed back to the third node N11. Because the third node N11 is coupled to the dummy bit lines DBL1 to DBL4, as shown in FIG. 4, the voltage of the dummy bit lines DBL1 to DBL4 is amplified and latched by the inverters 317 and 316.

When the voltage of the third node MN11 that is the voltage of the dummy bit lines DBL1 to DBL4 in FIG. 4 has a logic "high" state, the voltage of the third node MN11 is amplified by the inverters 307 and 306 and becomes a complete logic "high" state. When the voltage of the third node MN11 that is the voltage of the dummy bit lines DBL1 to DBL4 in FIG. 4 has a logic "low" state, the voltage of the third node MN11 is amplified by the inverters 307 and 306 and becomes a complete logic "low" state.

When data stored in a cell array is outputted to the dummy bit lines DBL1 to DBL4, charge sharing is generated between the dummy bit lines DBL1 to DBL4 and the cell capacitor of a memory cell. Therefore, in order to sense the voltage applied to the dummy bit lines DBL1 to DBL4 in FIG. 4 in the test write mode, the circuit to amplify the voltage signal applied to the dummy bit lines DBL1 to DBL4 in FIG. 4 is required to change the voltage signal into a voltage signal having a complete logic "high" state or a complete logic "low" state.

Charge sharing between the dummy bit lines DBL1 to DBL4 and the cell capacitor of a memory cell needs to be performed before outputting the data stored in the memory cell coupled to the dummy bit lines DBL1 to DBL4 in FIG. 4. Therefore, the circuit to amplify the data having an incomplete logic "high" state, which is a voltage near ½VDD, or an incomplete logic "low" state generated during charge sharing is required to change the voltage signal having an incomplete logic "high" state into a voltage signal having a complete logic "high" state, which has the VDD level, or to change the voltage signal having an incomplete logic "low" state into a voltage signal having a complete logic "low" state.

It is desirable that the inverter 316 in the latch circuit 315 shown in FIG. 6 has a lower current driving capability than the inverter 317 for the latch circuit 315 shown in FIG. 6 so as not to affect the voltage level of the dummy bit lines DBL1 to DBL4 shown in FIG. 4. Therefore, it is desirable that the PMOS transistor MP33 and the NMOS transistor MN33 included in the inverter 316 have a short channel width and a long channel length.

Figure 7:
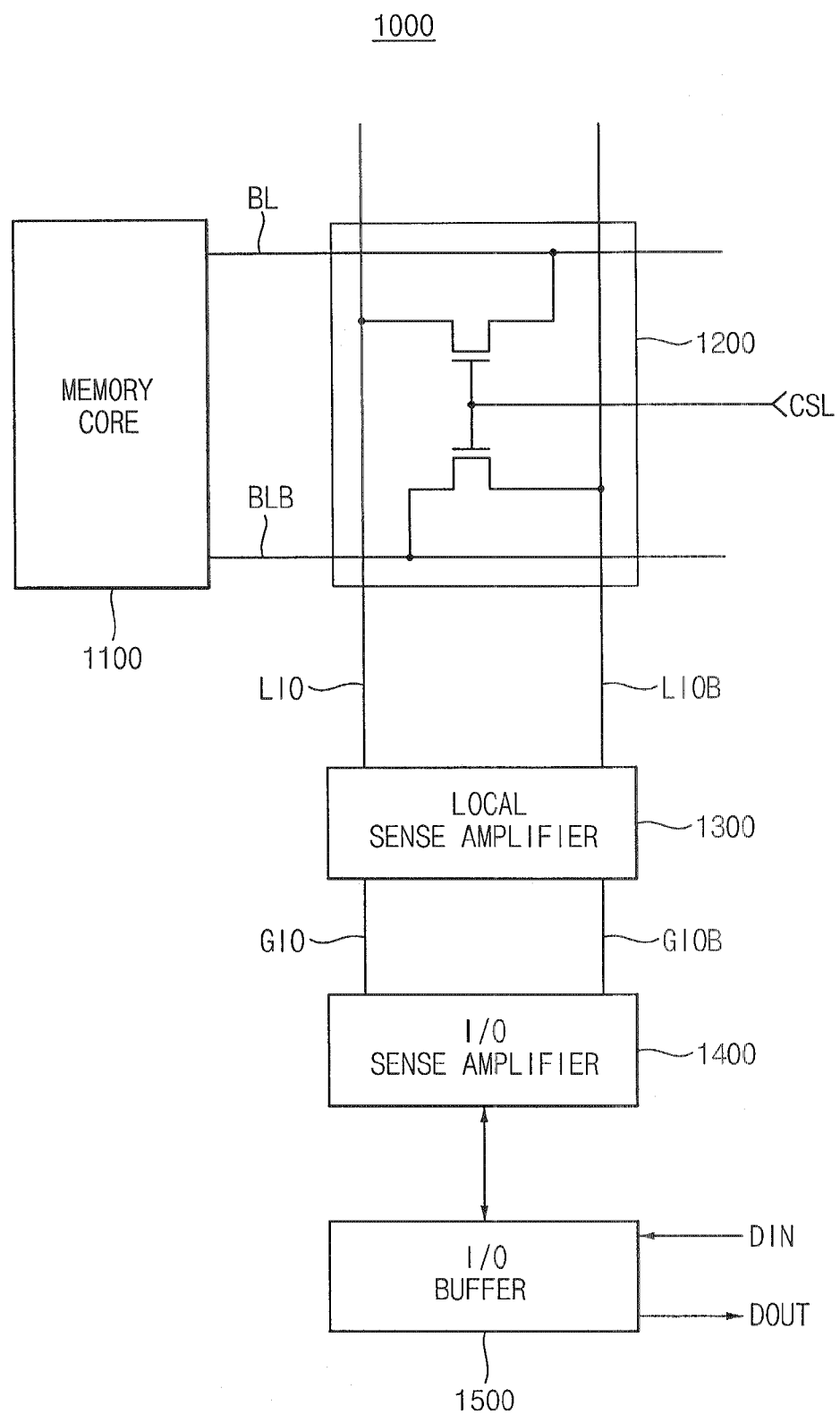
FIG. 7 is a circuit diagram illustrating a semiconductor memory device having a memory core according to an exemplary embodiment of the present invention.

FIG. 7 is a circuit diagram illustrating a semiconductor memory device having a memory core according to an exemplary embodiment of the present invention.

Referring to FIG. 7, the semiconductor memory device 1000 includes a memory core coupled to bit line pairs BL and BLB, a column selecting circuit 1200, a local sense amplifier 1300, an input/output sense amplifier 1400 and an input/output buffer 1500.

The column selecting circuit 1200 provides voltage signals of the bit lien pairs BL and BLB to local input/output line pairs LIO and LIOB in response to a column selecting signal CSL. The local sense amplifier 1300 amplifies voltage signals of the local input/output line pairs LIO and LIOB to provide the amplified voltage signals to a global input/output line pair GIO and GIOB. The input/output sense amplifier 1400 amplifies voltage signals of the global input/output line pair GIO and GIOB. The input/output buffer 1500 buffers an output signal of the input/output sense amplifier 1400 for output or buffers input data.

The memory core 300 shown in FIG. 4 may be used for the memory core 1100 included in the semiconductor memory device 1000 shown in FIG. 7.

In connection with what is shown in FIG. 4, the method of testing the semiconductor memory device 1000 shown in FIG. 7 includes writing data to bit lines BL1 to BL4 in a test write mode, providing a voltage signal having a logic state opposite from a logic state of voltage signals of the bit lines BL1 to BL4 to the dummy bit lines DBL1 to DBL4 in the test write mode, and amplifying and latching the voltage signals of the dummy bit lines DBL1 to DBL4 in a test sensing mode.

As described above, the memory core of the semiconductor memory device according to an exemplary embodiment of the present invention may change a voltage of dummy bit lines included in an edge sub-array into a voltage having a complete logic state by amplifying voltage signals of the dummy bit lines using a dummy bit line control circuit. Accordingly, defects that may be present in a memory cell array may be easily examined.

The foregoing is illustrative of exemplary embodiments of the present invention and is not to be construed as limiting thereof. Although exemplary embodiments of the present invention have been described, those skilled in the art will readily appreciate that many modifications are possible in the exemplary embodiments without materially departing from the novel teachings and advantages of the present invention. Accordingly, all such modifications are intended to be included within the scope of the present invention as defined in the claims. Therefore, it is to be understood that the foregoing is illustrative of the present invention and is not to be construed as limited to the exemplary embodiments disclosed, and that modifications to the exemplary embodiments, as well as other embodiments, are intended to be included within the scope of the appended claims. The present invention is defined by the following claims, with equivalents of the claims to be included therein.

What is claimed is:

1. A memory core comprising:
   an edge sub-array having a plurality of word lines, a plurality of bit lines and a plurality of dummy bit lines; and
   a dummy bit line control circuit configured to amplify and latch voltage signals of the dummy bit lines in a test sensing mode.

2. The memory core of claim 1, wherein the dummy bit line control circuit is configured to provide a bit line precharge voltage to the plurality of dummy bit lines in a normal mode, and configured to provide a voltage signal having a logic state opposite from a logic state of voltage signals of the plurality of bit lines to the plurality of dummy bit lines in a test write mode.

3. The memory core of claim 2, wherein the dummy bit line control circuit comprises:
   a first switch configured to provide the bit line precharge voltage to the plurality of dummy bit lines in response to a normal mode signal;
   a second switch configured to provide a high supply voltage or a low supply voltage to the plurality of dummy bit lines in response to a test write mode signal; and
   a latch circuit configured to amplify and latch the voltage signals of the plurality of dummy bit lines in response to a test sensing mode signal.

4. The memory core of claim 3, wherein the latch circuit is configured to be not operated when the test sensing mode signal is disabled.

5. The memory core of claim 3, wherein the latch circuit has a feedback loop configured to buffer the voltage signals of the plurality of dummy bit lines.

6. The memory core of claim 3, wherein the first switch includes a MOS transistor or a transmission gate.

7. The memory core of claim 3, wherein the second switch includes a MOS transistor or a transmission gate.

8. The memory core of claim 3, wherein the latch circuit comprises:
an inverter configured to invert the test sensing mode signal;
a first PMOS transistor having a gate coupled to an output terminal of the inverter, and a source to which a first supply voltage is applied;
a second PMOS transistor having a gate coupled to the output terminal of the inverter, and a source to which the first supply voltage is applied;
a first NMOS transistor having a gate to which the test sensing mode signal is applied, and a source to which a second supply voltage is applied;
a second NMOS transistor having a gate to which the test sensing mode signal is applied, and a source to which the second supply voltage is applied;
a third PMOS transistor having a source coupled to a drain of the first PMOS transistor, a drain coupled to a first node, and a gate coupled to a second node;
a third NMOS transistor having a drain coupled to the first node, a gate coupled to the second node, and a source coupled to a drain of the first NMOS transistor;
a fourth PMOS transistor having a source coupled to a drain of the second PMOS transistor, a drain coupled to the second node, and a gate coupled to a third node; and
a fourth NMOS transistor having a drain coupled to the second node, a gate coupled to the third node, and a source coupled to a drain of the second NMOS transistor,
wherein the third node is electrically coupled to the first node and the plurality of dummy bit lines.

9. The memory core of claim 8, wherein the latch circuit further comprises:
a fifth NMOS transistor having a gate coupled to a drain of the inverter, a drain coupled to the second node, and a source coupled to the second supply voltage.

10. The memory core of claim 9, wherein the fifth NMOS transistor is configured to maintain a voltage of the second node in a logic "low" state when the test sensing mode signal is in a logic "low" state.

11. The memory core of claim 9, wherein the fifth NMOS transistor is configured to determine an initial voltage of the second node in the test sensing mode.

12. The memory core of claim 9, wherein a channel length of the third PMOS transistor is longer than a channel length of the fourth PMOS transistor, and a channel length of the third NMOS transistor is longer than a channel length of the fourth NMOS transistor.

13. A semiconductor memory device comprising:
a memory core coupled to bit line pairs;
a column selecting circuit configured to provide voltage signals of the bit line pairs to local input/output line pairs in response to a column selecting signal;
a local sense amplifier configured to amplify voltage signals of the local input/output line pairs to provide the amplified voltage signals to global input/output line pairs;
an input/output sense amplifier configured to amplify voltage signals of the global input/output line pairs; and
an input/output buffer configured to buffer and output an output signal of the input/output sense amplifier and to buffer input data,
wherein the memory core includes:
an edge sub-array having a plurality of word lines, a plurality of bit lines and a plurality of dummy bit lines; and
a dummy bit line control circuit configured to amplify and latch voltage signals of the plurality of dummy bit lines in a test sensing mode.

14. The memory core of claim 13, wherein the dummy bit line control circuit is configured to provide a bit line precharge voltage to the plurality of dummy bit lines in a normal mode, and configured to provide a voltage signal having a logic state opposite from a logic state of voltage signals of the plurality of bit lines in a test write mode.

15. The memory core of claim 14, wherein the dummy bit line control circuit comprises:
a first switch configured to provide the bit line precharge voltage to the plurality of dummy bit lines in response to a normal mode signal;
a second switch configured to provide a high supply voltage or a low supply voltage to the plurality of dummy bit lines in response to a test write mode signal; and
a latch circuit configured to amplify and latch the voltage signals of the plurality of dummy bit lines in response to a test sensing mode signal.

16. The memory core of claim 15, wherein the latch circuit is configured to be not operated when the test sensing mode signal is disabled.

17. The memory core of claim 15, wherein the latch circuit has a feedback loop configured to buffer the voltage signals of the plurality of dummy bit lines.

18. A method of testing a semiconductor memory device, comprising:
writing data to bit lines in a test write mode;
providing a voltage signal, having a logic state opposite from a logic state of voltage signals of the bit lines, to dummy bit lines in the test write mode; and
amplifying and latching the voltage signals of the dummy bit lines in a test sensing mode.

19. The method of testing a semiconductor memory device of claim 18, further comprising:
buffering and feeding back the voltage signals of the dummy bit lines.

* * * * *